United States Patent
Niles et al.

(10) Patent No.: US 10,111,287 B2
(45) Date of Patent: Oct. 23, 2018

(54) SYNCHRONOUS SWITCHING CIRCUIT

(71) Applicant: SEMICONDUCTOR COMPONENTS INDUSTRIES, LLC, Phoenix, AZ (US)

(72) Inventors: Andrew Niles, Mesa, AZ (US); Kevin Joseph O'Connor, Tempe, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/253,386

(22) Filed: Aug. 31, 2016

(65) Prior Publication Data

US 2017/0079101 A1    Mar. 16, 2017

Related U.S. Application Data

(60) Provisional application No. 62/219,110, filed on Sep. 15, 2015.

(51) Int. Cl.
*H05B 33/08* (2006.01)
*H01L 29/866* (2006.01)
*H01L 49/02* (2006.01)

(52) U.S. Cl.
CPC ......... *H05B 33/0824* (2013.01); *H01L 28/00* (2013.01); *H01L 28/20* (2013.01); *H01L 29/866* (2013.01); *H05B 33/0812* (2013.01); *H05B 33/0845* (2013.01); *Y02B 20/343* (2013.01)

(58) Field of Classification Search
CPC ............ H05B 33/0815; H05B 33/0827; H05B 33/083; H05B 33/0848; H05B 33/0812; H05B 33/0884; H05B 37/02; H05B 33/08; H05B 33/0824; H05B 33/0845; H01L 27/0647; H01L 28/20; H01L 29/866
USPC .... 315/247, 185 S, 224, 225, 307–326, 291, 315/246, 75, 74, 107, 121–128, 119, 315/185 R, 209 R–211, 294
See application file for complete search history.

(56) References Cited

U.S. PATENT DOCUMENTS

| | | | |
|---|---|---|---|
| 5,479,330 A * | 12/1995 | Bergk | H02J 7/022 320/164 |
| 8,847,516 B2 * | 9/2014 | Chobot | H05B 33/083 315/210 |
| 2010/0253302 A1 * | 10/2010 | Otte | H02M 3/155 323/282 |
| 2011/0175532 A1 | 7/2011 | Peng | |
| 2012/0153869 A1 | 6/2012 | Sadwick et al. | |
| 2013/0187555 A1 | 7/2013 | Pan et al. | |
| 2013/0200801 A1 * | 8/2013 | Fratti | H05B 33/0827 315/122 |
| 2013/0257827 A1 * | 10/2013 | Hsieh | G09G 3/342 345/204 |
| 2014/0021860 A1 * | 1/2014 | Baccarin | H05B 33/0824 315/77 |

(Continued)

*Primary Examiner* — Jimmy Vu
(74) *Attorney, Agent, or Firm* — Rennie William Dover

(57) ABSTRACT

An electrical circuit, in some embodiments, comprises a control circuit having a plurality of switches and an electrical load having a plurality of load components. A first of the plurality of switches is configured to control a first of the plurality of load components. A second of the plurality of switches is configured to control a second of the plurality of load components synchronously with the first of the plurality of switches.

19 Claims, 2 Drawing Sheets

(56) References Cited

U.S. PATENT DOCUMENTS

2014/0097754 A1* 4/2014 Chiang ............... H05B 33/089
  315/122
2014/0239824 A1 8/2014 Li
2014/0265892 A1 9/2014 Chang et al.
2015/0042234 A1 2/2015 Lee et al.

* cited by examiner

SYNCHRONOUS SWITCHING CIRCUIT

CROSS-REFERENCE TO RELATED APPLICATIONS

This non-provisional application claims priority to provisional U.S. Application No. 62/219,110, which was filed on Sep. 15, 2015 and is incorporated herein by reference.

BACKGROUND

An electrical circuit may include a plurality of sub-circuits (e.g., electrical components or groups of electrical components) that interact with one another. In some electrical circuit implementations, it may be advantageous to predict or control switching events for one sub-circuit with respect to another sub-circuit. For example, it may be advantageous to activate or deactivate one switch based on activation or deactivation of another switch. Such switching, however, may be difficult to implement.

SUMMARY

At least some of the embodiments disclosed herein are directed to an electrical circuit comprising: a control circuit having a plurality of switches; and an electrical load having a plurality of load components, wherein a first of the plurality of switches is configured to control a first of the plurality of load components, and wherein a second of the plurality of switches is configured to control a second of the plurality of load components synchronously with the first of the plurality of switches. Such embodiments may be supplemented in a variety of ways, including by adding any of the following concepts in any sequence and in any combination: wherein each of the plurality of switches comprises a transistor; wherein each of the plurality of switches comprises a n-type semiconductor (NPN) bipolar junction transistor (BJT) or a p-type semiconductor (PNP) BJT; wherein an input of the first of the plurality of switches is coupled to a power supply; wherein an input of the second of the plurality of switches is coupled to the input of the first of the plurality of switches via a diode; wherein the diode is a Zener diode; wherein the input of the first of the plurality of switches is coupled to a cathode of the Zener diode; wherein the input of the second of the plurality of switches is coupled to an anode of the Zener diode; wherein the Zener diode compensates for a variation in performance of the plurality of switches caused by a change in temperature of at least one of the plurality of switches or the plurality of load components; and wherein at least some of the plurality of load components comprise a light emitting diode (LED).

At least some of the embodiments are directed to a control circuit, comprising: a first transistor configured to switch a first component of an electrical load into an electrical circuit, the first transistor having a first transistor input; and a second transistor configured to switch a second component of the electrical load into the electrical circuit synchronously with the first transistor, the second transistor having a second transistor input coupled to the first transistor input. Such embodiments may be supplemented in a variety of ways, including by adding any of the following concepts in any sequence and in any combination: wherein the second transistor input is coupled to the first transistor input via a Zener diode; wherein the first transistor input is coupled to a cathode of the Zener diode; wherein the second transistor input is coupled to an anode of the Zener diode; wherein the Zener diode is configured to compensate for a temperature drift among at least some of the first transistor, the second transistor, the first component of the electrical load, and the second component of the electrical load; wherein the second transistor input is coupled to the anode of the Zener diode via an output of a voltage divider that comprises a plurality of resistors; wherein the first transistor comprises a p-type semiconductor (PNP) bipolar junction transistor (BJT); wherein the second transistor comprises a n-type semiconductor (NPN) BJT; wherein when the second transistor switches the second component of the electrical load into the electrical circuit, the second transistor reconfigures at least a portion of the electrical load of the electrical circuit from a parallel topology to a series topology; and wherein when the second transistor switches the second component of the electrical load into the electrical circuit synchronously with the first transistor, the second transistor switches the second component of the electrical load into the electrical circuit simultaneously with the first transistor or consecutively with the first transistor.

At least some of the embodiments are directed to a synchronous switching circuit, comprising: a p-type semiconductor (PNP) bipolar junction transistor (BJT) comprising: a first base terminal coupled to a voltage source; a first emitter terminal coupled to the voltage source; and a first collector terminal coupled to a first load component; a diode having a first terminal coupled to the first base terminal of the PNP BJT and a second terminal; and a n-type semiconductor (NPN) bipolar junction transistor (BJT) comprising: a second base terminal coupled to the second terminal of the diode and a ground potential; a second emitter terminal coupled to the ground potential; and a second collector terminal coupled to a second load component and the voltage source. Such embodiments may be supplemented in a variety of ways, including by adding any of the following concepts in any sequence and in any combination: wherein the diode is a Zener diode; wherein the first terminal of the diode is a cathode, and wherein the second terminal of the diode is an anode; wherein the first base terminal is coupled to the voltage source via a first resistor coupled between the first base terminal and the voltage source; wherein the second collector terminal is coupled to the voltage source via a second resistor coupled between the second collector terminal and the voltage source; wherein the second base terminal is coupled to the second terminal of the diode and the ground potential via a voltage divider comprising a third resistor and a fourth resistor; wherein the third resistor is coupled between the second base terminal and the second terminal of the diode; wherein the fourth resistor is coupled between the second base terminal and the ground potential; and wherein the PNP BJT and the NPN BJT activate or deactivate to control the first load component and the second load component simultaneously or consecutively.

BRIEF DESCRIPTION OF THE DRAWINGS

There are disclosed in the drawings and in the following description specific systems for the synchronization of a plurality of switching events in electrical circuits. In the drawings.

Figure 1A:
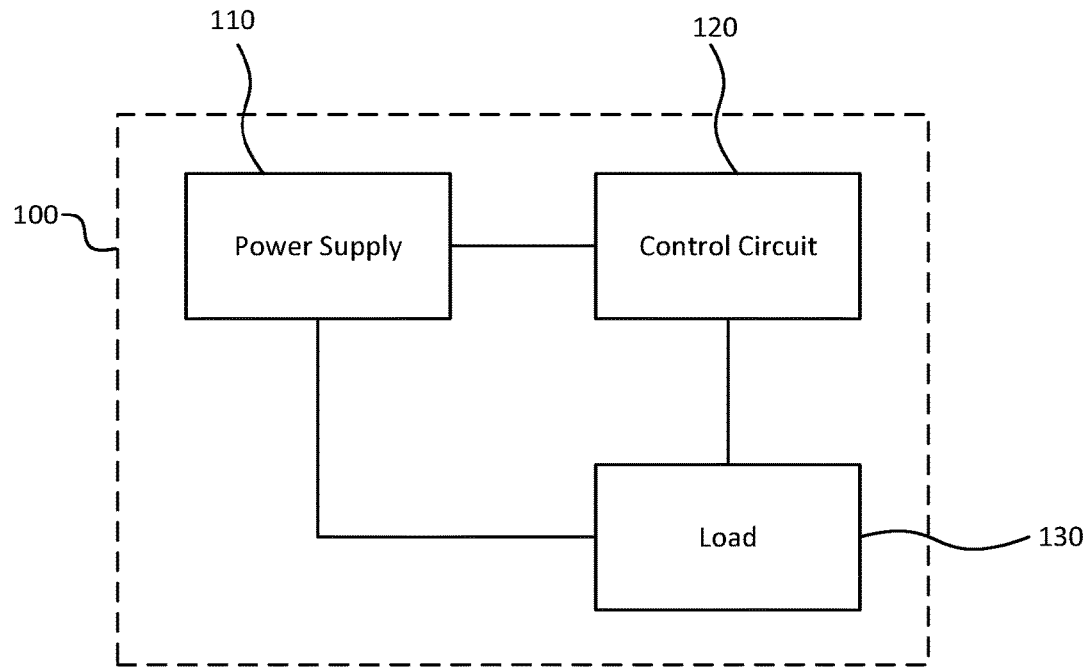
FIG. 1A is a conceptual block diagram of an electrical circuit including a control circuit used for synchronization of a plurality of switching events.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Disclosed herein are embodiments for the synchronization of a plurality of switching events in electrical circuits. More precisely, at least some embodiments are directed to control circuitry configured to receive an input signal that controls switching events and to provide a plurality of switching signals to synchronously switch a plurality of components. As used herein, a switching event is an action taken by an electrical component that electrically couples or decouples one or more electrical components from an electrical circuit. Additionally, as used herein, synchronously may mean a plurality of switches switching simultaneously such that each of the plurality of switches toggles states at approximately the same time, or the plurality of switches switching consecutively such that each of the plurality of switches toggles states one after another with no, or approximately no, passage or delay of time. For example, a plurality of events (e.g., switching events) or actions (e.g., switches toggling states) occurring synchronously may occur within five nanoseconds of each other. Because the disclosed control circuitry synchronous switches the plurality of components, a switching time of the plurality of components may be precisely predicted and controlled. As a result, the disclosed control circuitry increases efficiency (e.g., by modifying an amount of current available in an electrical circuit based on a configuration of a load of the electrical circuit) and reduces harmonics and optimizes a power factor of the electrical circuit (e.g., by matching a current waveform of the electrical circuit to a voltage waveform of the electrical circuit).

FIG. 1A is a conceptual block diagram of an electrical circuit 100 including a control circuit 120 used to synchronize a plurality of switching events. FIG. 1A illustrates the electrical circuit 100 as including a power supply 110 coupled to the control circuit 120 and a load 130 coupled to the power supply 110 and the control circuit 120. The control circuit 120 may include a plurality of couplings to the load 130 based at least in part, for example, on a desired number of synchronous switching events (e.g., the control circuit 120 may include two couplings to the load 130 to provide synchronous switching for two switching events of the electrical circuit, and as such, the control circuit 120 may be a synchronous control circuit and/or a synchronous switching circuit). As such, the control circuit functions in accordance with embodiments described herein to control the load 130. Although the electrical circuit 100 is illustrated herein as including the power supply 110, the control circuit 120, and the load 130, the electrical circuit 100 may include any number of circuits or components and is not to be limited to the exemplary configuration shown and described herein.

Figure 1B:
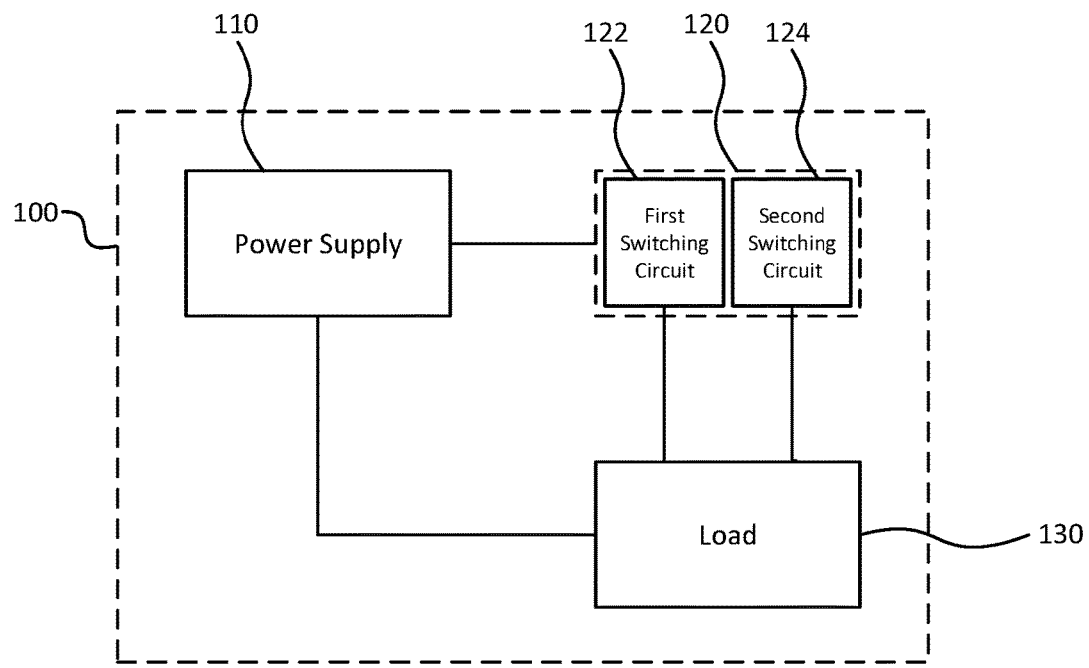
FIG. 1B is a conceptual schematic of a control circuit used to synchronize a plurality of switching events.

FIG. 1B includes a conceptual block diagram of the control circuit 120 used for synchronization of a plurality of switching events. The control circuit 120 includes a first switching circuit 122 configured to control a first switching event and a second switching circuit 124 configured to control a second switching event synchronously with the first switching event. Although the control circuit 120 is illustrated herein as including two switching circuits, the control circuit 120 may include any number of switching circuits according to a desired number of synchronous switching events (e.g., for synchronization of n switching events, the control circuit 120 may include n switching circuits) and is not limited to the exemplary configuration shown and described herein. Further, the control circuit 120 may include any number of additional electrical components configured to couple the first switching circuit 122 to the second switching circuit 124 (or, more generally, to couple together any two or more of the n switching circuits).

Each of the first switching circuit 122 and the second switching circuit 124 may comprise a transistor configured to operate as a switch, as well as supporting electrical components that aid in the operation of the transistor or facilitate coupling between the first switching circuit 122 and the second switching circuit 124. The transistor may be a bipolar junction transistor (BJT), a field-effect transistor (FET), or any other transistor or combination of transistors understood by one of ordinary skill in the art as suitable for operating as a switch. When the first switching circuit 122 or the second switching circuit 124 utilizes a BJT, the BJT may be a n-type (or n-doped) semiconductor (NPN) BJT or a p-type (or p-doped) semiconductor (PNP) BJT. Each of the first switching circuit 122 and the second switching circuit 124 may utilize the same type of BJT (e.g., NPN or PNP) or may utilize a different type of BJT. Additionally, it should be noted that a circuit utilizing a NPN BJT may be reconfigured to utilize a PNP BJT, and vice versa, as a trivial matter by one of ordinary skill in the art. Accordingly, while certain circuits discussed herein are described as utilizing one of a NPN BJT or a PNP BJT, or as utilizing a BJT in place of a FET, the disclosed circuits are not to be limited to the exemplary configuration shown and described herein, but rather are intended to include various transistor substitutions along with electrical components or circuit configurations that correspond to the transistor substitutions.

The first switching circuit 122 is coupled to the power supply 110, the load 130, and the second switching circuit 124, and, based on a configuration of the electrical circuit 100, a ground potential (e.g., via a change in state of a component of the electrical circuit 100, thereby coupling the first switching circuit 122 to a ground rail coupled to the power supply 110). Based, at least in part, on a voltage received from the power supply (e.g., a voltage sensed by the first switching circuit 122 on the power rail or power bus), the first switching circuit 122 may toggle or change states (e.g., from an active or "on" state to an inactive or "off" state or vice versa). Alternatively, the first switching circuit 122 may toggle states based, at least in part, on the ground potential (e.g., when at least a portion of the first switching circuit 122 is coupled to the ground potential via a component of the electrical circuit 100). The first switching circuit 122 may toggle states to control a first switching event such as switching at least a first portion of the load 130 into, or out of, the electrical circuit 100. For example, the first switching circuit 122 toggling states may switch the first portion of the load 130 into the electrical circuit 100 by providing a voltage to the first portion of the load 130 or completing a circuit of the first portion of the load 130 (e.g., by completing a path that enables electrons to flow through the first portion of the load 130). Alternatively, the first switching circuit 122 toggling states may switch the first portion of the load 130 out of the electrical circuit 100 by ceasing to provide a voltage to the first portion of the load 130 or creating an open circuit of the first portion of the load 130 (e.g., by breaking a path of the first portion of the load 130 such that electrons no longer flow through the first portion of the load 130).

The second switching circuit 124 is coupled to the power supply 110, the load 130, the ground potential, and, based on a configuration of the electrical circuit 100, the first switching circuit 122 (e.g., via a change in state of a component of the electrical circuit 100, thereby coupling the second switching circuit 124 to the first switching circuit 122). As such, the second switching circuit 124 may be coupled to the first switching circuit via one or more electrical components (not shown), one or more of which may change states based on a condition existing in the electrical circuit 100 to couple the second switching circuit 124 to the first switching circuit 122. Based, at least in part, on a voltage received via the coupling to the first switching circuit 122, the second switching circuit 124 may toggle or change states (e.g., from an active or "on" state to an inactive or "off" state or vice versa). Alternatively, the second switching circuit 124 may toggle states based, at least in part, on the ground potential (e.g., when at least a portion of the second switching circuit 124 is coupled to the ground potential via a component of the electrical circuit 100). The second switching circuit 124 may toggle states to control a second switching event such as switching at least a second portion of the load 130 into, or out of, the electrical circuit 100. For example, the second switching circuit 124 toggling states may switch the second portion of the load 130 into, or out of, the electrical circuit 100 in a manner substantially similar to that discussed above with respect to the first switching circuit 122.

Based on the coupling between the first switching circuit 122 and the second switching circuit 124, the second switching circuit 124 may toggle states synchronously with the first switching circuit 122. For example, the second switching circuit 124 may toggle states simultaneously with the first switching circuit 122 such that both the first switching circuit 122 and the second switching circuit 124 toggle states at approximately the same time. Alternatively, the second switching circuit 124 may toggle states consecutively with the first switching circuit 122 such that one of the first switching circuit 122 or the second switching circuit 124 toggles states immediately after the other of the first switching circuit 122 or the second switching circuit 124 such that there is no, or approximately no, perceivable passage of time between the first switching circuit 122 and the second switching circuit 124 toggling states.

Figure 2:
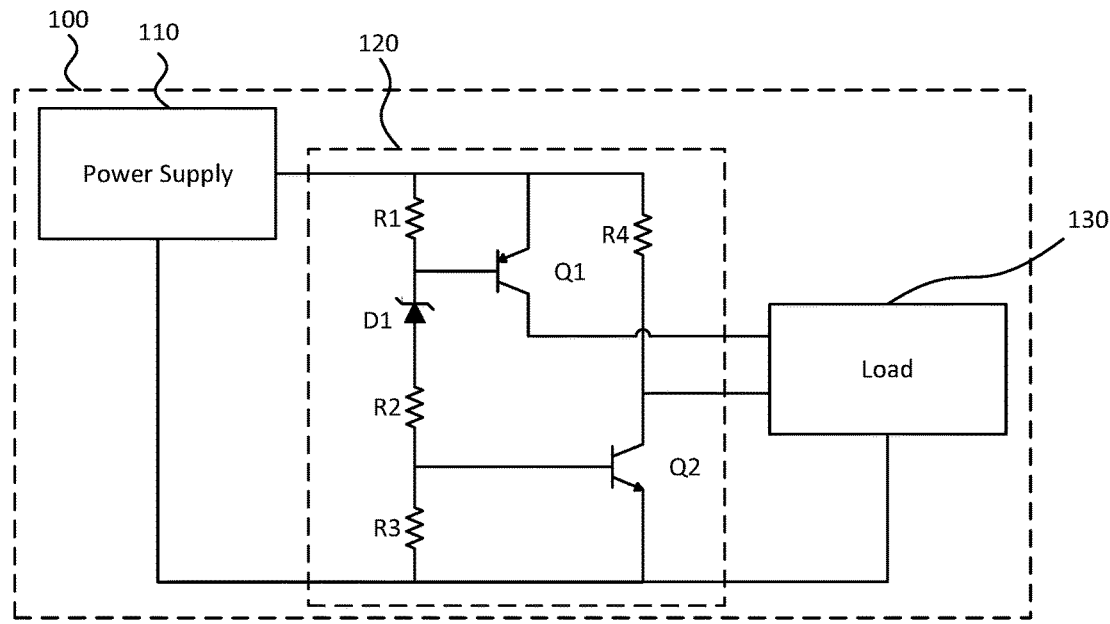
FIG. 2 is a circuit schematic of a control circuit used to synchronize a plurality of switching events.

FIG. 2 is a circuit schematic of an embodiment of the control circuit 120 used to synchronize a plurality of switching events. The control circuit 120 comprises a PNP BJT Q1 (e.g., implemented as the first switching circuit 122, discussed above), a NPN BJT Q2 (e.g., implemented as the second switching circuit 124, discussed above), and a Zener diode D1 coupling the NPN BJT Q2 to the PNP BJT Q1. The PNP BJT Q1 and the NPN BJT Q2 are configured to control separate portions of the load 130 synchronously (e.g., simultaneously or consecutively), as discussed above. For example, based on a single input voltage received from the power supply 110, both the PNP BJT Q1 and the NPN BJT Q2 may toggle states synchronously, correspondingly affecting separate portions of the load 130 synchronously.

Each of the PNP BJT Q1 and the NPN BJT Q2 includes a base terminal, a collector terminal, and an emitter terminal configured to couple to various components of the electrical circuit 100. As shown in FIG. 2, the base terminal of the PNP BJT Q1 is coupled to the power supply 110 via a resistor R1 coupled between the base terminal of the PNP BJT Q1 and the power supply 110, as well as coupled to a cathode of the Zener diode D1. The emitter terminal of the PNP BJT Q1 is coupled to the power supply 110 without any intervening components. Alternatively, one or more electrical components, such as a resistor, may be between the emitter terminal of the PNP BJT Q1 and the power supply 110. The collector terminal of the PNP BJT Q1 is coupled to at least a first portion of the load 130 to control a switching event of at least the first portion of the load 130. For example, when the PNP BJT Q1 is in an active or "on" state, electrons may pass between the emitter terminal of the PNP BJT Q1 and the collector terminal of the PNP BJT Q1, thereby completing a circuit between the power supply 110 and at least the first portion of the load 130 and causing a voltage and current to be available to at least the first portion of the load 130.

Generally, the PNP BJT Q1 may be considered a switch capable of being turned "off" or "on" based on a voltage supplied to the PNP BJT Q1. When a voltage difference between the base terminal of the PNP BJT Q1 and the emitter terminal of the PNP BJT Q1 (e.g., a voltage present at the emitter terminal of the PNP BJT Q1 minus a voltage present at the base terminal of the PNP BJT Q1) rises above a predefined threshold determined by a manufacturer or composition of the PNP BJT Q1 (e.g., commonly in the range of 0.6 volts to 0.7 volts), the PNP BJT Q1 may toggle or switch from an inactive or "off" state to an active or "on" state. In some embodiments, the "on" state may also be defined as a period in which the PNP BJT Q1 operates in a saturation region of operation. When the PNP BJT Q1 toggles to the "on" state, the PNP BJT Q1 may enable a flow of electrons between the emitter terminal of the PNP BJT Q1 and the collector terminal of the PNP BJT Q1 that is inhibited when the PNP BJT Q1 is not in the "on" state. Conversely, when the voltage difference between the base terminal of the PNP BJT Q1 and the emitter terminal of the PNP BJT Q1 falls below the predefined threshold, the PNP BJT Q1 may toggle or switch from the active or "on" state to the inactive or "off" state and no longer allow a flow of electrons between the emitter terminal of the PNP BJT Q1 and the collector terminal of the PNP BJT Q1. In this way, the PNP BJT Q1 functions as a switch for at least the first portion of the load 130 that switches the first portion of the load 130 into, or out of, the electrical circuit 100 based on an active or inactive state of the PNP BJT Q1.

The emitter terminal of the NPN BJT Q2 is coupled to the ground potential without any intervening components. Alternatively, one or more electrical components, such as a resistor, may be positioned between the emitter terminal of the NPN BJT Q2 and the ground potential. The collector terminal of the NPN BJT Q2 is coupled to the power supply 110 via a resistor R4 coupled between the collector terminal of the NPN BJT Q2 and the power supply 110. The collector terminal of the NPN BJT Q2 is also coupled to at least a second portion of the load 130 to control a switching event of at least the second portion of the load 130. For example, when the NPN BJT Q2 is in an inactive or "off" state, electrons may pass from the power supply 110 through the resistor R4 to at least the second portion of the load 130 causing a voltage and current to be available to at least the second portion of the load 130. When the NPN BJT Q2 is in an active or "on" state, the NPN BJT Q2 completes a circuit from the resistor R4 to the ground potential, thereby creating a path of least resistance over which a majority of electrons passing through the resistor R4 will flow. As such, when the NPN BJT Q2 is in an active or "on" state, a negligible voltage and current is available to at least the second portion of the load 130, thereby effectively removing at least the second portion of the load 130 from the electrical circuit 100.

Generally, the NPN BJT Q2 may also be considered a switch capable of being turned "off" or "on" based on a voltage supplied to the NPN BJT Q2. When a voltage difference between the base terminal of the NPN BJT Q2 and the emitter terminal of the NPN BJT Q2 (e.g., a voltage present at the base terminal of the NPN BJT Q2 minus a voltage present at the emitter terminal of the NPN BJT Q2) rises above a predefined threshold determined by a manufacturer or composition of the NPN BJT Q2 (e.g., commonly in the range of 0.6 volts to 0.7 volts), the NPN BJT Q2 may toggle or switch from an inactive or "off" state to an active or "on" state. In some embodiments, the "on" state may also be defined as a period in which the NPN BJT Q2 operates in a saturation region of operation. When the NPN BJT Q2 toggles to the "on" state, the NPN BJT Q2 may enable a flow of electrons between the collector terminal of the NPN BJT Q2 and the emitter terminal of the NPN BJT Q2 that is inhibited when the NPN BJT Q2 is not in the "on" state. Conversely, when the voltage difference between the base terminal of the NPN BJT Q2 and the emitter terminal of the NPN BJT Q2 falls below the predefined threshold, the NPN BJT Q2 may toggle or switch from the active or "on" state to the inactive or "off" state and no longer allow a flow of electrons between the collector terminal of the NPN BJT Q2 and the emitter terminal of the NPN BJT Q2. In this way, the NPN BJT Q2 functions as a switch for at least the second portion of the load 130 that switches the second portion of the load 130 into, or out of, the electrical circuit 100 based on an active or inactive state of the NPN BJT Q2.

The base terminal of the NPN BJT Q2 is coupled to an anode of the Zener diode D1 via a resistor R2. The base terminal of the NPN BJT Q2 is also coupled to a resistor R3 coupled between the base terminal of the NPN BJT Q2 and the ground potential such that the resistor R2 and the resistor R3 form a voltage divider having an output at the base terminal of the NPN BJT Q2. Via the coupling of the NPN BJT Q2 to the PNP BJT Q1 via the Zener diode D1, the NPN BJT Q2 switches synchronously with the PNP BJT Q1, for example, as discussed above with respect to FIG. 1B.

Based on a Zener voltage (which may also be referred to as a breakdown or reverse voltage) of the Zener diode D1, both the NPN BJT Q2 and the PNP BJT Q1 may toggle states. For example, when a voltage received at the Zener diode D1 through the resistor R1 is less than the Zener voltage, the Zener diode D1 functions as a blocking diode, effective blocking a flow of electrons received at the Zener diode D1 through the resistor R1 through the Zener diode D1. When electrons received at the Zener diode D1 through the resistor R1 do not flow through the Zener diode D1, the base terminal of the PNP BJT Q1 may be tied to the power supply via the resistor R1 to maintain the PNP BJT Q1 in an "off" state. Similarly, when electrons received at the Zener diode D1 through the resistor R1 do not flow through the Zener diode D1, the base terminal of the NPN BJT Q2 may be tied to the ground potential via the resistor R3 to maintain the NPN BJT Q2 in an "off" state.

Alternatively, when a voltage received at the Zener diode D1 through the resistor R1 is greater than the Zener voltage, the Zener diode D1 enables a flow of electrons in a reverse direction (e.g., from the cathode to the anode) through the Zener diode D1 from the resistor R1 and the base terminal of the PNP BJT Q1 to the resistors R2 and R3 and the base terminal of the NPN BJT Q2. When the Zener diode D1 enables the flow of electrons in the reverse direction, the base terminal of the PNP BJT Q1 may be coupled to the ground potential to cause the PNP BJT Q1 to toggle to the "on" state. For example, by coupling the base terminal of the PNP BJT Q1 to the ground potential, a voltage difference between the emitter terminal of the PNP BJT Q1 and the base terminal of the PNP BJT Q1 may be greater than a threshold for activation of the PNP BJT Q1, thereby causing the PNP BJT Q1 to toggle to the "on" state, as discussed above. Similarly, when the Zener diode D1 enables the flow of electrons in the reverse direction, the base terminal of the NPN BJT Q2 may be coupled to the power supply 110 to cause the NPN BJT Q2 to toggle to the "on" state. As such, the Zener diode D1 enables the NPN BJT Q2 to switch synchronously with the PNP BJT Q1 based on the flow of electrons through the Zener diode D1.

In some embodiments, performance and responses of electrical components, such as the PNP BJT Q1, NPN BJT Q2, and those comprising the load 130, may vary (e.g., undergo a temperature drift) based on a temperature of the electrical circuit 100 (e.g., as a result of exposure to a given ambient or environmental temperature) or its various components. For example, for each degree of temperature of a given unit of measurement (e.g., Fahrenheit or Celsius), a voltage drop across a component of the load 130 may vary by a known amount (e.g., for each degree of temperature difference the voltage drop decreases by x volts). Similarly, for each degree of temperature, a voltage difference between base and emitter terminals of each of the PNP BJT Q1 and the NPN BJT Q2 may vary by a known amount (e.g., for each degree of temperature difference the voltage drop decreases by y volts). To compensate for the temperature drift in the electrical circuit 100, the Zener diode D1 may be selected to have an opposite temperature response, for example, for each degree of temperature difference the Zener voltage increases by z volts such that z+y=x.

It should be noted that although the resistors R1, R2, R3, and R4 are illustrated and each described as a single resistor, in practice each of the resistors R1, R2, R3, and R4 may comprise any number of resistors combined in parallel and/or series to provide a desired amount of resistance or response in the electrical circuit 100. While resistor R1 may be generally selected to have a relatively low amount of resistance (e.g., 422 ohms), resistors R2 and R3 are selected as described below with respect to equation 1, and resistor R4 may be generally selected to have a relatively high amount of resistance (e.g., 510,000 (510 k) ohms), it should further be noted that a response of the control circuit 120, and thereby the electrical circuit 100, may be controlled or modified by controlling an amount of resistance provided by one or more of the resistors R1, R2, R3, and R4. For example, by modifying an amount of resistance provided by resistors R1 and R3, a point at which the PNP BJT Q1 and the NPN BJT Q2, respectively, toggle states with respect to a voltage provided by the power supply 110 may be controlled to be a higher or lower power supply voltage. Similarly, by modifying an amount of resistance provided by resistors R2, the control circuit may be adjusted based on a voltage requirement of the load 130 or some portion of the load 130 (e.g., a combined forward voltage drop of a plurality of light emitting diodes (LEDs) when the load 130 includes the plurality of LEDs and the plurality of LEDs are controlled directly or indirectly by the control circuit 120). Additionally, it should be noted that the schematic shown in FIG. 2 does not limit the scope of the disclosure, and other circuit configurations that accomplish the objectives of the control circuit 120 as described herein are contemplated and fall within the scope of the disclosure.

Figure 3:
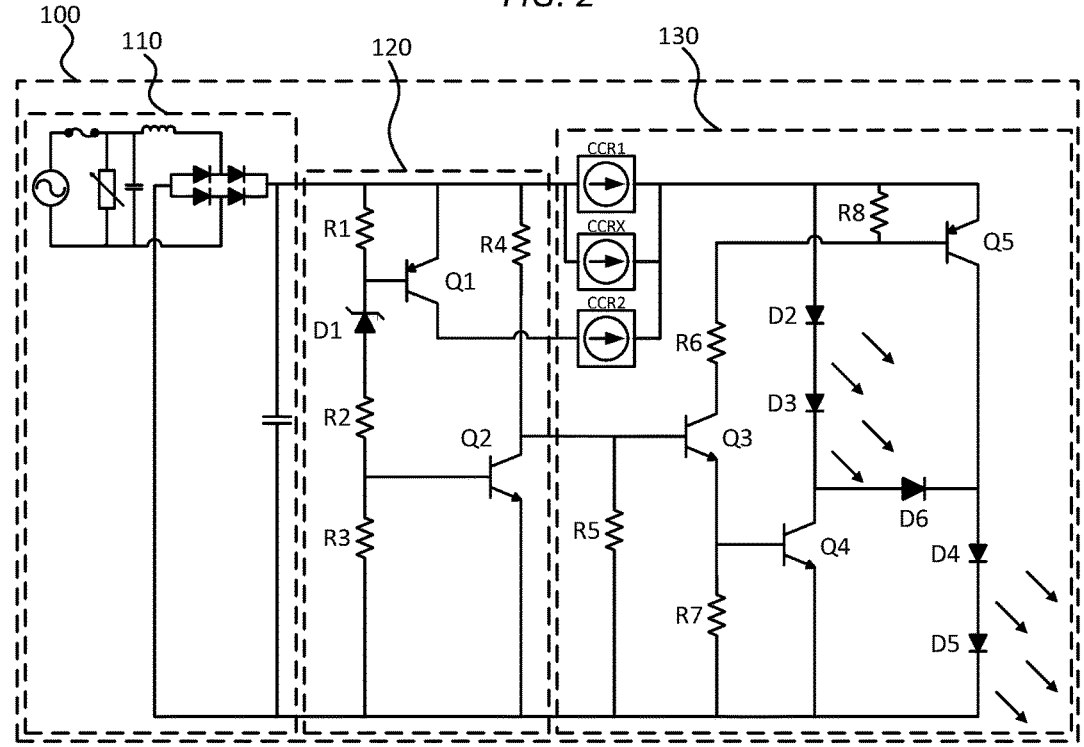
FIG. 3 is a circuit schematic of an electrical circuit including a control circuit used for synchronization of a plurality of switching events.

FIG. 3 is a circuit schematic of an embodiment of the electrical circuit 100 including the control circuit 120 used for synchronization of a plurality of switching events. FIG. 3 illustrates that the power supply 110 may be an alternating current power supply (e.g., having a voltage in a range of 100 volts to 140 volts, or any other suitable range) along with supporting electrical components configured to convert an output of the alternating current power supply to an approximation of a direct current power supply. The power supply 110 may be readily understood and well-known by one of ordinary skill in the art, and as such a detailed description of the operation of the power supply 110 is not included herein. The control circuit 120 may operate substantially as described above with respect to FIGS. 1A, 1B, and 2. The load 130 may comprise an LED load (e.g., the LEDs D2, D3, D4, and D5 such that the electrical circuit 100 may be considered or referred to as a lighting circuit), as well as various components such as current sources (e.g., one or more constant current amplifiers illustrated as CCR1, CCR2, and CCRX), one or more transistors (e.g., as illustrated by transistors Q3, Q4, and Q5) to function as switches, for example, as described above, one or more diodes (e.g., as illustrated by D6), and one or more resistors (e.g., as illustrated by resistors R5, R6, R7, and R8).

The load 130 may be configurable such that, based on an output of the control circuit 120 (e.g., such as based on a status of the NPN BJT Q2 which results from an instantaneous high-level voltage or low-level voltage provided by the power supply 110), the LEDs may be configured to operate in a parallel manner (when the instantaneous voltage provided by the power supply 110 is relatively low) or in a series manner (when the instantaneous voltage provided by the power supply 110 is relatively high). For example, as illustrated in FIG. 3, when the NPN BJT Q2 is in an "off" state, the LEDs may operate in a parallel manner (e.g., by virtue of the transistors Q3, Q4, and Q5 being in an "on" state) in which two branches of two LEDs each operate separately. When the NPN BJT Q2 is in an "on" state, the LEDs may operate in a series manner (e.g., by virtue of the transistors Q3, Q4, and Q5 being in an "off" state) in which the diode D6 bridges together two sets of two LEDs to form a single series coupling of four LEDs. When the LEDs operate in the series manner, in some embodiments it may be advantageous to provide the LEDs with an additional amount of current, for example, to optimize one or more characteristics of the electrical circuits 100 or the LEDs. For example, according to well-known principles of circuit design, it may be known that a level of efficiency of electrical circuit 100 may be increased when the LEDs are operating in the series manner by providing increased current to the LEDs. Additionally, the control circuit 120 dynamically reconfiguring the electrical circuit 100 to operate in the parallel manner or the series manner based on an output level of the power supply 110 may reduce flickering of the LEDs (e.g., based on variations an increase or decrease in the output of the power supply 110) and/or aid in dimmability of the LEDs (e.g., based on a dimmer coupled to the electrical circuit 100). Furthermore, providing the additional current may optimize harmonics in the electrical circuit 100 and/or optimize a power factor of the electrical circuit 100. For example, generally, to optimize harmonics or a power factor of the electrical circuit 100, it may be desirable to match a current waveform of the electrical circuit 100 (e.g., as measured through the LEDs) to a voltage waveform of the electrical circuit (e.g., as measured at the LEDs). As such, by switching an additional amount of current into the electrical circuit 100, the control circuit 120 may cause the current waveform of the electrical circuit 100 to match the voltage waveform of the electrical circuit 100 more closely than before the control circuit 120 switched the additional amount of current into the electrical circuit 100.

As discussed above, the NPN BJT Q2 is configured to switch at least a portion of the load 130 into, or out of, the electrical circuit 100. A voltage provided by the power supply 110 at which the NPN BJT Q2 will toggle states to switch at least a portion of the load 130 into, or out of, the electrical circuit 100 may be determined according to:

$$V_{switch} = V_{be}\left(\frac{R2 + R3}{R3}\right) + V_z + \text{offset}, \quad (1)$$

in which $V_{switch}$ is the voltage provided by the power supply 110 at which the NPN BJT Q2 will toggle states, $V_{be}$ is the predetermined threshold at which the NPN BJT Q2 toggles from the "off" state to the "on" state, R2 is an amount of resistance of resistor R2 and R3 is an amount of resistance of resistor R3, both as described above, $V_z$ is the zener voltage of zener diode D1, and offset is an optional desired offset value (e.g., such that the NPN BJT Q2 switches at the load voltage, such as the total forward voltage drop of the LEDs when operating in series, plus the offset). As discussed above, based on a desired performance of the electrical circuit 100, various parameters of the control circuit and the above equation 1 may be modified. For example, to adjust operation of the control circuit for a modified total forward voltage drop of the LEDs, a value of resistance of the resistor R2 may be modified. The schematic shown in FIG. 3 is exemplary and does not limit the scope of the disclosure. Other circuit configurations that accomplish the objectives of the control circuit 120 and/or the electrical circuit 100 as described herein are contemplated and fall within the scope of the disclosure.

Numerous other variations and modifications will become apparent to those skilled in the art once the above disclosure is fully appreciated. It is intended that the following claims be interpreted to embrace all such variations, modifications and equivalents. In addition, the term "or" should be interpreted in an inclusive sense.

What is claimed is:
1. An electrical circuit, comprising:
   a control circuit having a plurality of switches; and
   an electrical load coupled to the control circuit and having a plurality of load components, wherein a first of the plurality of switches is configured to control a first of the plurality of load components, and wherein a second of the plurality of switches is configured to control a second of the plurality of load components synchronously with the first of the plurality of switches, and wherein an input of the second of the plurality of switches is coupled to an input of the first of the plurality of switches via a diode.
2. The electrical circuit of claim 1, wherein each of the plurality of switches comprises a transistor.
3. The electrical circuit of claim 2, wherein each of the plurality of switches comprises a n-type semiconductor (NPN) bipolar junction transistor (BJT) or a p-type semiconductor (PNP) BJT.
4. The electrical circuit of claim 1, wherein the input of the first of the plurality of switches is coupled to a power supply.

5. The electrical circuit of claim 4, wherein the diode is a Zener diode, wherein the input of the first of the plurality of switches is coupled to a cathode of the Zener diode, and wherein the input of the plurality of switches is coupled to an anode of the Zener diode.

6. The electrical circuit of claim 5, wherein the Zener diode compensates for a variation in performance of the plurality of switches caused by a change in temperature of at least one of the plurality of switches or the plurality of load components.

7. The electrical circuit of claim 1, wherein at least some of the plurality of load components comprise a light emitting diode (LED).

8. A control circuit, comprising:
a first transistor configured to switch a first component of an electrical load into an electrical circuit, the first transistor having a first transistor input; and
a second transistor configured to switch a second component of the electrical load into the electrical circuit synchronously with the first transistor, the second transistor having a second transistor input coupled to the first transistor input; and a Zener diode, wherein the Zener diode couples the second transistor input to the first transistor.

9. The control circuit of claim 8, wherein the first transistor input is coupled to a cathode of the Zener diode, wherein the second transistor input is coupled to an anode of the Zener diode, and wherein the Zener diode is configured to compensate for a temperature drift among at least some of the first transistor, the second transistor, the first component of the electrical load, and the second component of the electrical load.

10. The control circuit of claim 9, wherein the second transistor input is coupled to the anode of the Zener diode via an output of a voltage divider that comprises a plurality of resistors.

11. A control circuit, comprising:
a first transistor configured to switch a first component of an electrical load into an electrical circuit, the first transistor having a first transistor input; and
a second transistor configured to switch a second component of the electrical load into the electrical circuit synchronously with the first transistor, the second transistor having a second transistor input coupled to the first transistor input, wherein the first transistor comprises a p-type semiconductor (PNP) bipolar junction transistor (BJT), and wherein the second transistor comprises a n-type semiconductor (NPN) BJT.

12. A control circuit, comprising:
a first transistor configured to switch a first component of an electrical load into an electrical circuit, the first transistor having a first transistor input; and
a second transistor configured to switch a second component of the electrical load into the electrical circuit synchronously with the first transistor, the second transistor having a second transistor input coupled to the first transistor input, wherein in response to the second transistor switching the second component of the electrical load into the electrical circuit, the second transistor reconfigures at least a portion of the electrical load of the electrical circuit from a parallel topology to a series topology.

13. A control circuit, comprising:
a first transistor configured to switch a first component of an electrical load into an electrical circuit, the first transistor having a first transistor input; and
a second transistor configured to switch a second component of the electrical load into the electrical circuit synchronously with the first transistor, the second transistor having a second transistor input coupled to the first transistor input, wherein in response to the second transistor switching the second component of the electrical load into the electrical circuit synchronously with the first transistor, the second transistor switches the second component of the electrical load into the electrical circuit simultaneously with the first transistor or consecutively with the first transistor.

14. A synchronous switching circuit, comprising:
a p-type semiconductor (PNP) bipolar junction transistor (BJT) comprising:
a first base terminal coupled to a voltage source;
a first emitter terminal coupled to the voltage source; and
a first collector terminal coupled to a first load component;
a diode having a first terminal coupled to the first base terminal of the PNP BJT and a second terminal; and
a n-type semiconductor (NPN) bipolar junction transistor (BJT) comprising:
a second base terminal coupled to the second terminal of the diode and a ground potential;
a second emitter terminal coupled to the ground potential; and
a second collector terminal coupled to a second load component and the voltage source.

15. The synchronous switching circuit of claim 14, wherein the diode is a Zener diode, wherein the first terminal of the diode is a cathode, and wherein the second terminal of the diode is an anode.

16. The synchronous switching circuit of claim 14, wherein the first base terminal is coupled to the voltage source via a first resistor coupled between the first base terminal and the voltage source.

17. The synchronous switching circuit of claim 14, wherein the second collector terminal is coupled to the voltage source via a second resistor coupled between the second collector terminal and the voltage source.

18. The synchronous switching circuit of claim 14, wherein the second base terminal is coupled to the second terminal of the diode and the ground potential via a voltage divider comprising a third resistor and a fourth resistor, wherein the third resistor is coupled between the second base terminal and the second terminal of the diode, and wherein the fourth resistor is coupled between the second base terminal and the ground potential.

19. The synchronous switching circuit of claim 14, wherein the PNP BJT and the NPN BJT activate or deactivate to control the first load component and the second load component simultaneously or consecutively.

\* \* \* \* \*